United States Patent [19]
Ohta et al.

[11] Patent Number: 5,821,793
[45] Date of Patent: Oct. 13, 1998

[54] VARIABLE DELAY CIRCUIT AND A VARIABLE PULSE WIDTH CIRCUIT

[75] Inventors: Akira Ohta; Norio Higashisaka; Tetsuya Heima, all of Tokyo, Japan

[73] Assignee: Mitsubishi Denki Kabushiki Kaisha, Tokyo, Japan

[21] Appl. No.: 695,575

[22] Filed: Aug. 12, 1996

[30] Foreign Application Priority Data

Feb. 15, 1996 [JP] Japan ................................. 8-028070

[51] Int. Cl.⁶ .............................. H03K 5/13; H03K 7/08
[52] U.S. Cl. ......................................... 327/277; 327/176
[58] Field of Search ................................. 327/261, 172, 327/166, 276–278, 281, 176, 164

[56] References Cited

U.S. PATENT DOCUMENTS

| | | | |
|---|---|---|---|
| 4,797,585 | 1/1989 | Segawa et al. | 327/176 |
| 5,055,706 | 10/1991 | Nakai et al. | 327/172 |
| 5,276,664 | 1/1994 | Shikunami | 327/172 |
| 5,396,110 | 3/1995 | Houston | 327/172 |
| 5,418,406 | 5/1995 | Hirano et al. | 327/172 |
| 5,420,467 | 5/1995 | Huott et al. | 327/277 |
| 5,459,422 | 10/1995 | Behrin | 327/276 |
| 5,638,017 | 6/1997 | Kim | 327/277 |
| 5,646,565 | 7/1997 | Tukidate | 327/176 |

FOREIGN PATENT DOCUMENTS

| | | | |
|---|---|---|---|
| 4-22215 | 1/1992 | Japan | 327/176 |
| 4-331506 | 11/1992 | Japan | 327/172 |
| 4-358412 | 12/1992 | Japan | 327/172 |

OTHER PUBLICATIONS

"Proceedings of the IEEE 1991 Bipolar Circuits and Technology Meeting" (Sep. 9–10, 1991, Minneapolis, MN).

"A GaAs DCFL Variable Delay Circuit for 2.5 GHz", Tanaka et al., 1991 Spring National Convention Record, The Institute of Electronics, Information and Communication Engineers (Part 5).

*Primary Examiner*—Terry Cunningham
*Assistant Examiner*—Eunja Shin
*Attorney, Agent, or Firm*—Leydig, Voit & Mayer, Ltd.

[57] ABSTRACT

A variable delay circuit including an input terminal to which a signal to be delayed is input, a delay gate connected to the input terminal, a logical gate to which an input to the delay gate and an output from the delay gate are input and which forms a delayed signal, and an output terminal outputting the delayed signal formed by the logical gate. A control signal for controlling the delay gate is input to the delay gate.

11 Claims, 11 Drawing Sheets

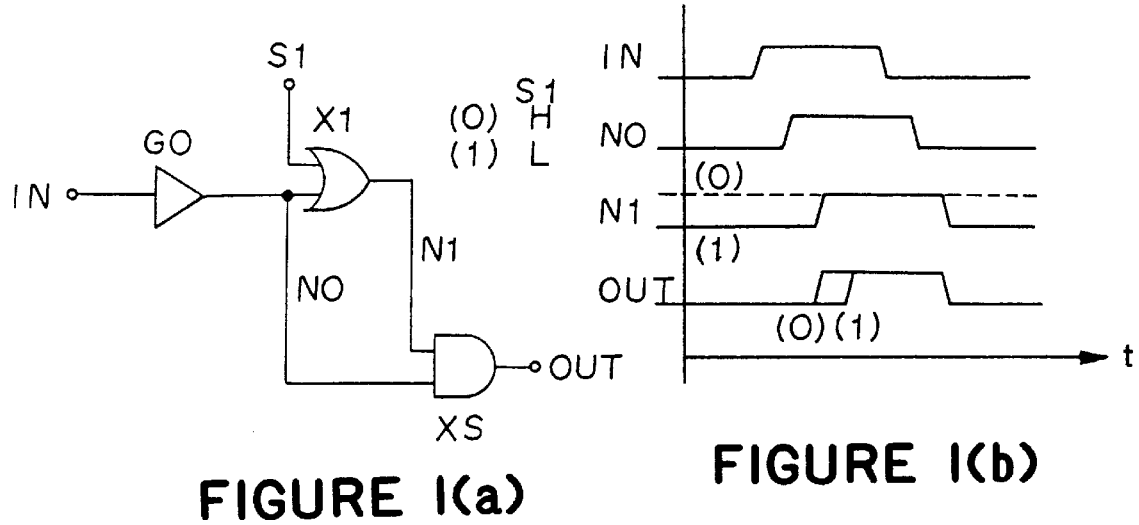
FIGURE I(a)
FIGURE I(b)

FIGURE 2(a)
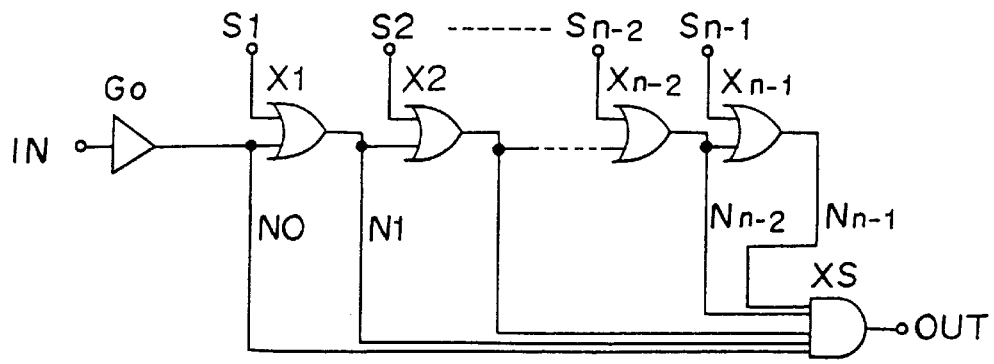
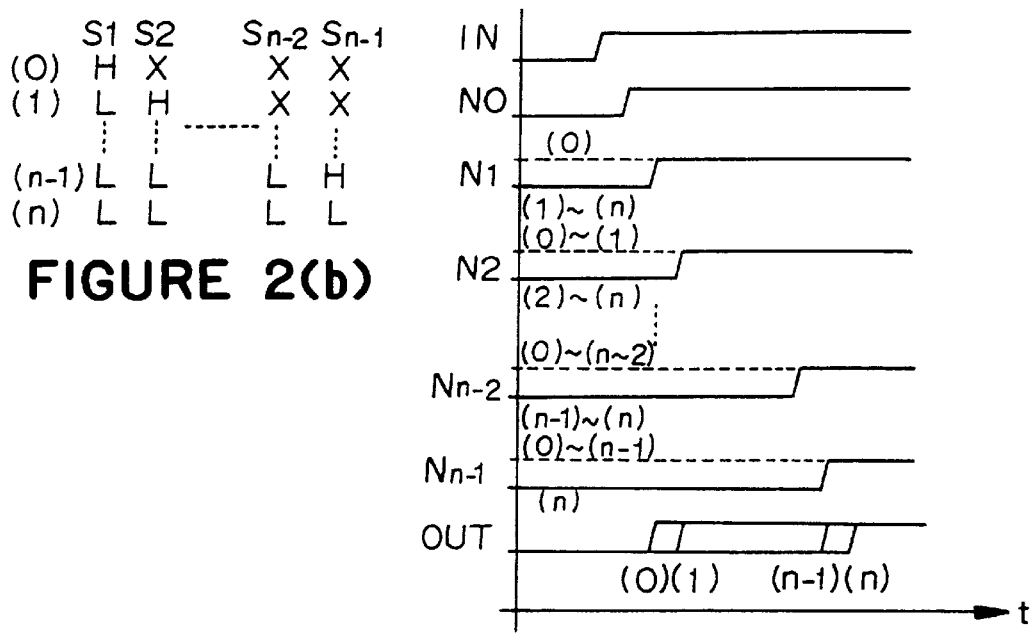
FIGURE 2(b)
FIGURE 2(c)
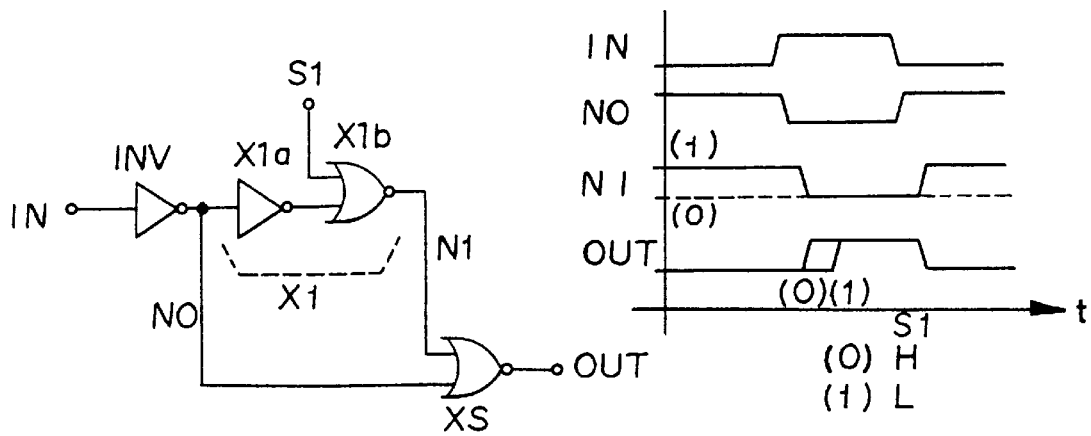
FIGURE 3(a)
FIGURE 3(b)

FIGURE 4(a)
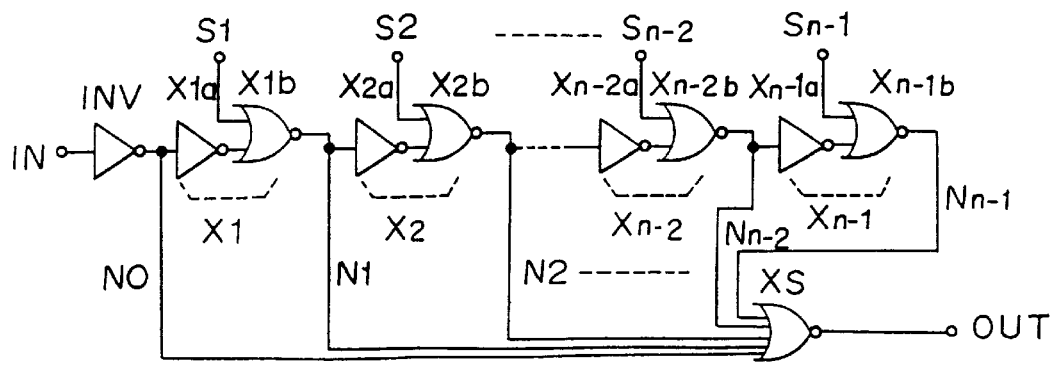
FIGURE 4(b)
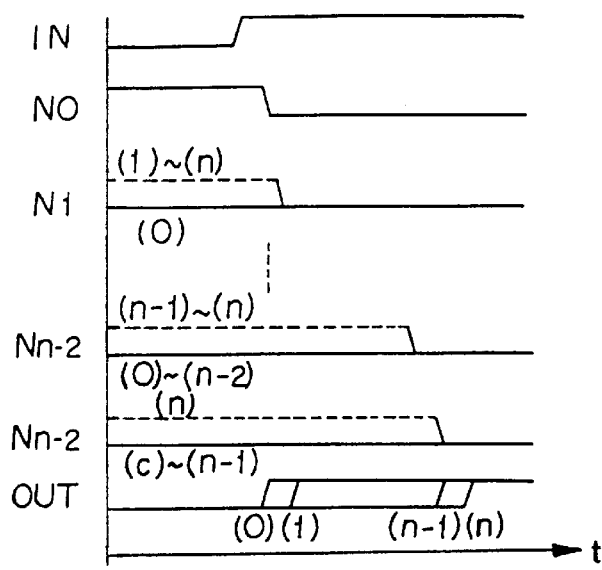
FIGURE 4(c)
FIGURE 5(a)
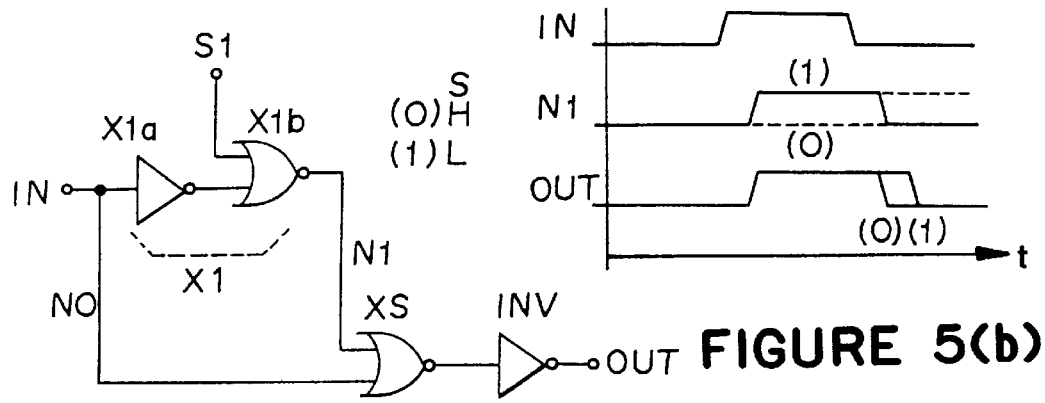
FIGURE 5(b)

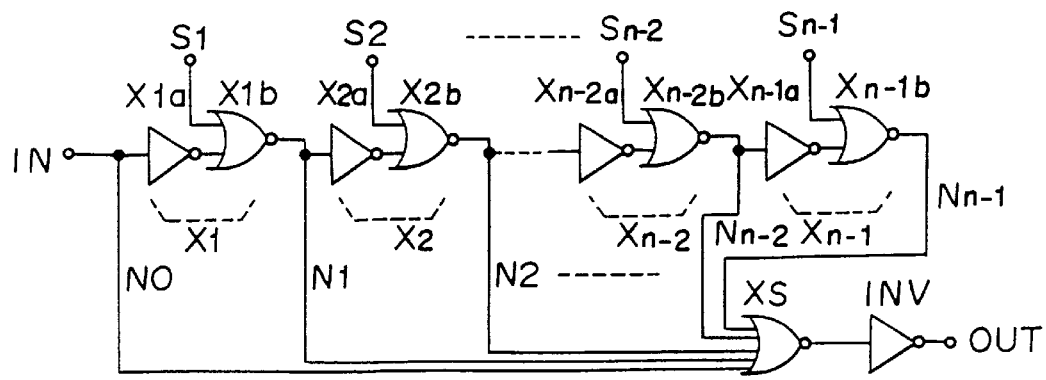
FIGURE 6(a)
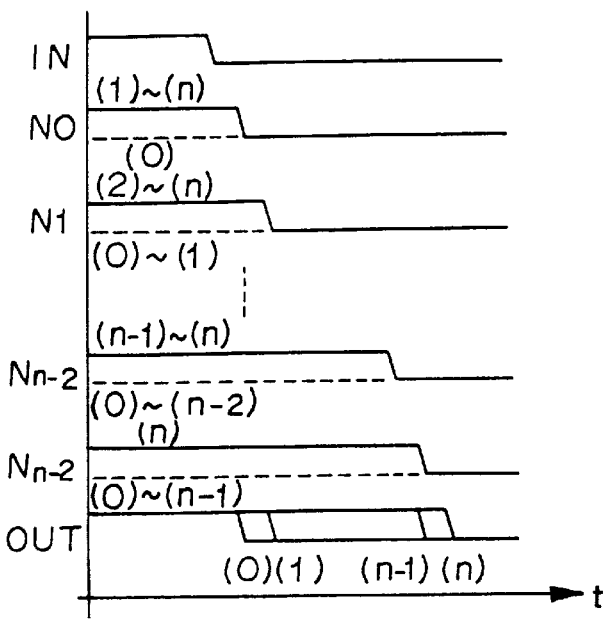
FIGURE 6(b)
FIGURE 6(c)
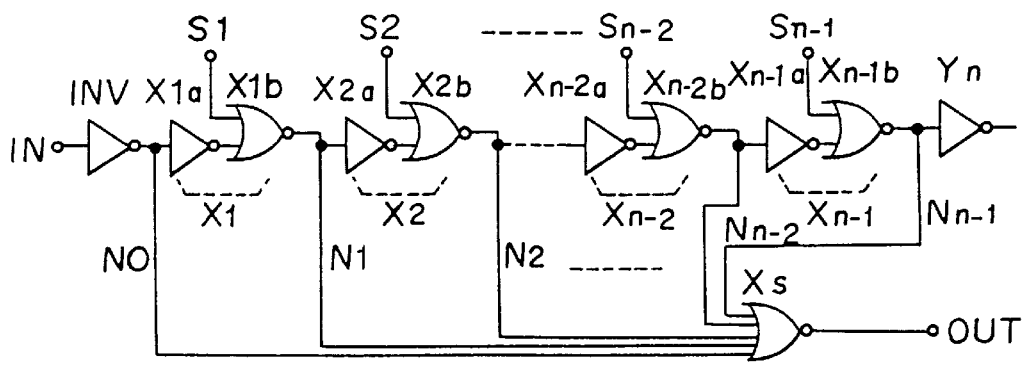
FIGURE 7

|     | S1a | S1b |
| --- | --- | --- |
| (0) | H   | X   |
| (1) | L   | L   |
| (2) | L   | H   |

(1) S1a=L, S1b=H (2) S1a=L, S1b=L

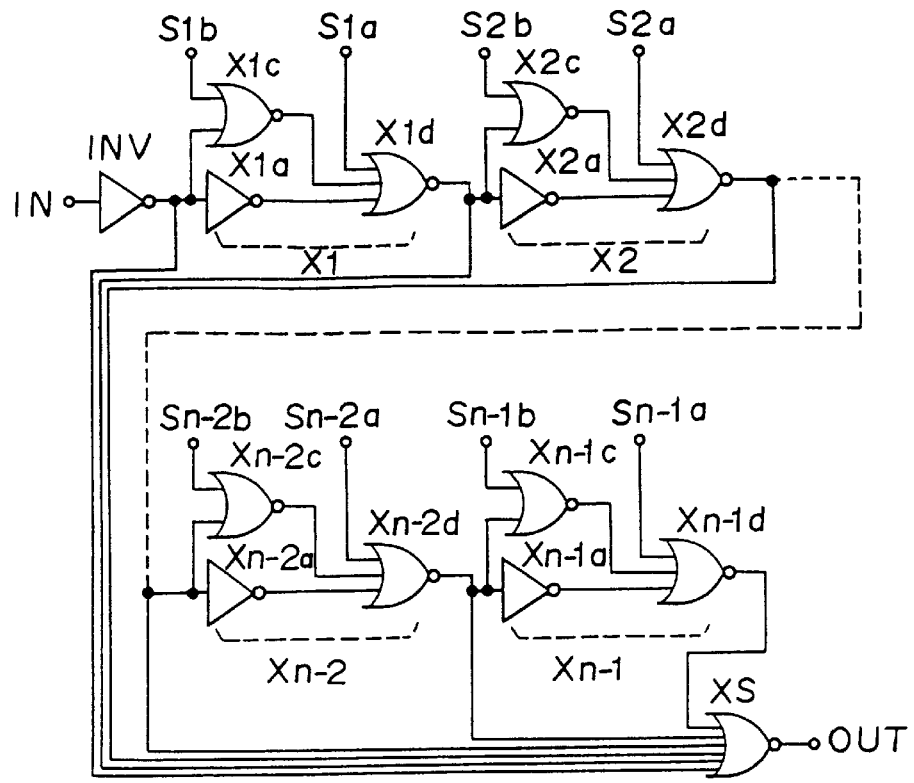
FIGURE 9(a)
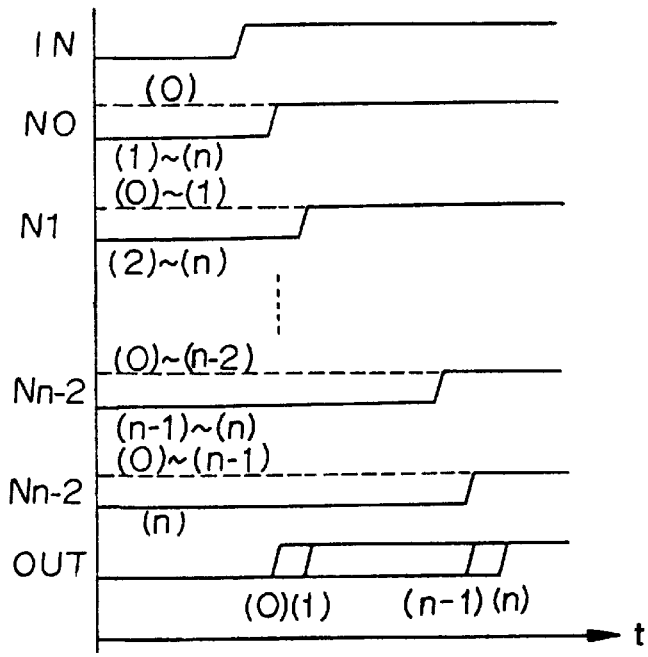
FIGURE 9(b)
FIGURE 9(c)

VARIABLE DELAY CIRCUIT AND A VARIABLE PULSE WIDTH CIRCUIT

BACKGROUND OF THE INVENTION

1. Field Of The Invention

The present invention relates to a variable delay circuit for providing desired timing signals using digital circuits and a ring oscillator and a variable pulse width circuit using the variable delay circuit, and, particularly, to improving a variable delay circuit comprising a chain of gates and a selector.

2. Background Art

FIG. 15 shows a conventional n bit variable delay circuit. In FIG. 15, notations W0 through Wn-1 designate n gates, forming a chain of gates (hereinafter a gate chain), mutually connected in series and WS designates a selector producing n:1 selecting signals N0 through Nn-1 from respective connecting points of the gates W0 through Wn-1. Further, IN designates an input terminal of the gate chain to which a signal to be delayed is input and OUT designates an output terminal outputting a delayed signal from the selector WS.

FIGS. 16(a) and 16(b) show a conventional 4-bit variable delay circuit where FIG. 16(a) indicates a case of n=4 in the n-bit variable delay circuit of FIG. 15, and FIG. 16(b) is a selector circuit. In FIGS. 16(a) and 16(b), notations E0 and E1 designate select signals for selecting signals N0 through N3 from the connecting points of the respective gates W0 through W3. IN designates an input terminal of the gate chain to which a signal to be delayed is input and OUT designates an output terminal outputting a delayed signal from the selector WS.

As shown in FIG. 15, in such a conventional variable delay circuit, pulse signals input from the input terminal IN of the gate chain propagate through the gate chain while being delayed by the respective gates W0 through Wn-1. When the select signals are provided to the selector WS, a pulse delayed in respect of a pulse input to the input terminal IN by a delay time specified as follows is output from the output terminal OUT of the selector WS.

(Delay Time)=k×tdg+tds (1≦k≦n) where tdg: delay time per stage of gate, tds: delay time of selector.

The conventional variable delay circuit poses a problem described with reference to FIGS. 16(a) and 16(b).

A delay from the input to the output of the variable delay circuit is classified into ① a delay of wiring from the input terminal IN to the gates, ② delays of the gates, ③ delays due to output loads (wirings etc.) of the gates, ④ delays of 3-input NOR gates at the first stage of the selector, ⑤ delays due to output loads (wrings etc.) of the 3-input NOR gates, ⑥ a delay of a 4-input NOR gate at the second stage of the selector and ⑦ a delay from the 4-input NOR gate at the second stage of the selector to the output terminal OUT.

The delay time of this circuit is $$(\text{Delay Time}) = td① + \sum_{i=0}^{k-1}(td② + td③) + td④k + td⑤k + td⑥ + td⑦ \quad (1)$$

where an output from a k-th stage gate (Wk-1) is selected by the selector WS.

To improve linearity of the delay time (maintain constant a variable width), values of td ② i, td ③ i, td ④ i, and td ⑤ i, in a range of 1≦i≦4, are made equal, respectively. Among the delays, ③ the delays due to output loads (wirings etc.) of the gates and ⑤ the delays by output loads (wirings etc.) of the 3-input NOR gates are changed by a layout pattern of the wirings.

To equalize the respective values of td ③ i and td ⑤ i in the range of 1≦i≦4, the lengths of the respective wirings of ③ and ⑤ in the range of 1≦i≦4 are to be equalized. However, it is difficult to equalize the lengths due to limitations in the gate arrangement or the like. Further, even if the lengths are equalized, the area occupied by the variable delay circuit is enlarged.

SUMMARY OF THE INVENTION

The present invention has been made to solve the above-mentioned problem and it is a first object of the present invention to provide a variable delay circuit having a simple structure in which the number of wirings and the number of gates are reduced.

Further, it is a second object to provide a variable delay circuit having a plurality of delay time resolutions.

Further, it is a third object to provide a ring oscillator using such variable delay circuits.

Still further, it is a fourth object to provide a pulse width variable circuit using such variable delay circuits.

According to a first aspect of the present invention, a variable delay circuit comprises:

an input terminal to which a signal to be delayed is input;

a delay gate connected to the input terminal;

a logical gate to which an input to the delay gate and an output from the delay gate are input and that produces a delayed signal; and an output terminal outputting the delayed signal from the logical gate wherein a control signal for controlling the delay gate is input to the delay gate.

According to a second aspect of the present invention, a variable delay circuit comprises:

an input terminal;

n (n is a positive integer larger than 1) stages of delay gates to which a signal to be delayed, and input to the input terminal, is input and which are connected in series so that outputs from the respective stages are input successively to following stages;

a logical gate to which the outputs of the respective stages of the delay gates are input and that produces a delayed signal; and an output terminal outputting the delayed signal produced by the logical gate wherein control signals for controlling the delay gates are input to at least one of the delay gates.

According to a third aspect of the present invention, the variable delay circuit according to the second aspect includes a load gate connected to the delay gate of an n-th stage.

According to a fourth aspect of the present invention, the variable delay circuit according to the second aspect includes at least two routes of n stages of delay gates.

According to a fifth aspect of the present invention, the variable delay circuit according to the fourth aspect includes load gates connected to respective stages of the delay gates in one of the two routes.

According to a sixth aspect of the present invention, in the variable delay circuit of any of the first through fifth aspects, the delay gate to which the control signal is input is an OR gate and the logical gate is an AND gate.

According to a seventh aspect of the present invention, in the variable delay circuit of any of the first through fifth aspects, the delay gate to which the control signal is input comprises an inverter and a NOR gate to which the control signal is input and the logical gate is a NOR gate.

According to an eighth aspect of the present invention, in the variable delay circuit of any of the first through fifth aspects, the delay gate to which the control signal is input comprises an inverter and two NOR gates to which two of the control signals are respectively input and the logical gate is a NOR gate.

According to a ninth aspect of the present invention, in the variable delay circuit of the seventh or eighth aspects, an inverter is provided between the input terminal and the delay gate and an output of the inverter is input to the logical gate.

According to a tenth aspect of the present invention, in the variable delay circuit of the seventh or eighth aspects, the signal to be delayed and input to the input terminal is input to the logical gate and an inverter is provided between the logical gate and the output terminal.

According to an eleventh aspect of the present invention, a ring oscillator includes the variable delay circuit of any of the first through tenth aspects with the gates connected in a ring circuit.

According to a twelfth aspect of the present invention, a ring oscillator includes a plurality of the variable delay circuits of any of the first through tenth aspects connected in a ring circuit.

According to a thirteenth aspect of the present invention, a pulse width variable circuit includes two of the variable delay circuits of any of the first through tenth aspects connected in series.

BRIEF DESCRIPTION OF THE DRAWINGS

FIGS. 1(a) and 1(b) show, respectively, a 2-bit variable delay circuit and a timing chart in accordance with Embodiment 1 of the invention;

FIGS. 2(a), 2(b), and 2(c) respectively show an n-bit variable delay circuit, its output states, and a timing chart in accordance with Embodiment 2 of the invention;

FIGS. 3(a) and 3(b) respectively show a 2-bit variable delay circuit and a timing chart in accordance with Embodiment 3 of the invention;

FIGS. 4(a), 4(b), and 4(c) respectively show an n-bit variable delay circuit and a timing chart in accordance with Embodiment 4 of the invention;

FIGS. 5(a) and 5(b) respectively show a 2-bit variable delay circuit and a timing chart in accordance with Embodiment 5 of the invention;

FIGS. 6(a), 6(b), and 6(c) respectively show an n-bit variable delay circuit, its output states, and a timing chart in accordance with Embodiment 6 of the invention;

FIG. 7 is a diagram showing an n-bit variable delay circuit in accordance with Embodiment 7 of the invention;

FIGS. 9(a), 9(b), and 9(c) respectively show an n-bit variable delay circuit, its output states, and a timing chart in accordance with Embodiment 9 of the invention;

DETAILED DESCRIPTION OF THE PREFERRED EMBODIMENTS

EMBODIMENT 1

Figure 8A:
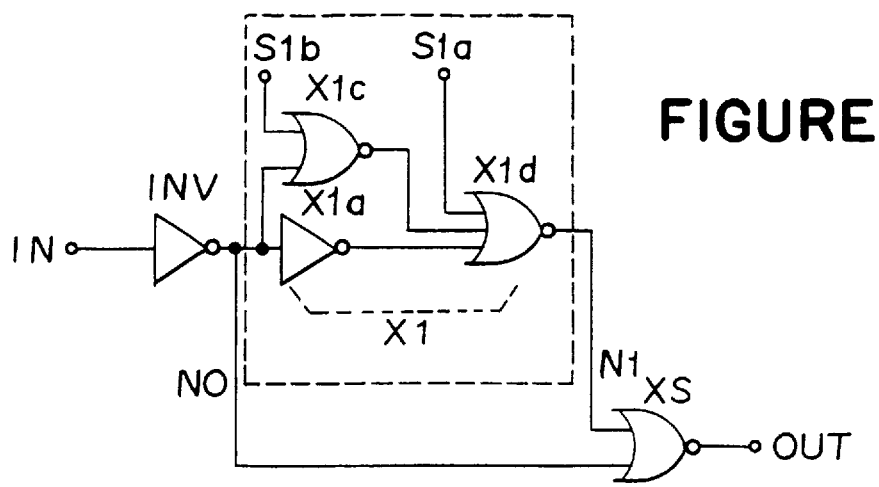
FIGS. 8(a), 8(b), 8(c), and 8(d) respectively show a 2-bit variable delay circuit, a timing chart, and two alternative inverters in accordance with Embodiment 8 of the invention.

FIGS. 1(a) and 1(b) respectively illustrate the structure of a 2-bit variable delay circuit and a timing chart in accordance with Embodiment 1 of the present invention. In FIG. 1(a), IN designates an input terminal to which a signal to be delayed is input, G0 designates a gate receiving a signal from the input terminal IN, X1 designates a delay gate, a 2-input OR gate, for receiving an output of the gate G0 and a control signal S1, and XS designates a logical gate, a 2-input AND gate, for receiving an output N0 from the gate G0 and an output N1 from the delay gate X1, which corresponds to the selector in the conventional technology. OUT designates an output terminal connected to the logical gate XS for outputting a delayed signal.

(1) A case where the control signal S1 is high (H):

The output N1 from the delay gate X1 is always H and, accordingly, an output waveform from the output terminal OUT is retarded by a delay time of G0+XS compared with an input waveform of the signal to be delayed, both at its leading edge and at its trailing edge.

(2) A case where the control signal S1 is low (L):

The output N1 of the delay gate X1 is retarded by a delay time of G0+X1 compared with the input waveform, both at its leading edge and at its trailing edge. Therefore, the output waveform is as follows.

(a) Trailing edge:

The trailing edge from the output N0 becomes effective. That is, the output waveform is retarded by a delay time of G0+XS compared with the input waveform. (This is the same as the case where the control signal S1 is H)

(b) Leading edge:

The leading edge from the output N1 becomes effective. That is, the output waveform is retarded by a delay time of G0+X1+XS compared with the input waveform. (The leading edge is delayed by a delay time of X1 compared with the case where the control signal S1 is H.)

Accordingly, when only the leading edge is noted, the leading edge can be retarded by the delay time of the delay gate X1 by switching the state of a control signal as H→L. In Embodiment 1, adjusting wirings are only present at two locations, the outputs of N0 and N1 (which correspond only to the output portions of the gates in the conventional example), and, therefore, restrictions on the layout pattern are alleviated. The wiring region can be downsized and the linearity of the delay time can be improved. Further, the number of gates and the power consumption can be reduced by simplifying the structure of the selector.

EMBODIMENT 2

FIGS. 2(a), 2(b), and 2(c) respectively illustrate the structure of an n-bit variable delay circuit, its output states, and a timing chart in accordance with Embodiment 2 of the present invention.

This circuit includes a gate G0 for receiving a signal from the input terminal IN, a delay gate Xl, a 2-input OR gate, for receiving an output from the gate G0 and a control signal Sl, delay gates Xk ($2 \leq k \leq n-1$) for receiving outputs Nk-1 of delay gates Xk-1 and control signals Sk, a logical gate XS, an n-input AND gate, for receiving the output N0 of the gate G0 and outputs Nk of the delay gates Xk and the output terminal OUT of the logical gate XS.

The trailing edge of the input data is output after a constant delay time irrespective of the control signals as in Embodiment 1. An explanation of the leading edge follows.
(1) A case where the control signal Sl is high (H):

The outputs Nl through Nn-1 are always H and, therefore, the leading edge of the output waveform from the output terminal OUT is retarded by a delay time of G0+XS.
(2) A case where Sl . . . Sk-1=L, Sk=H ($2 \leq k \leq n-1$):

The outputs Nk through Nk-1 are always H and the outputs Nl through Nk-1 are respectively retarded by (k1) stages of the delay gates. In this case the leading edge of the output waveform is retarded, compared with the input waveform, by a delay time of G0+(Xl through Xk-1) or ((k-1) stages of delay gates)+XS.

The delay time of the leading edge of this circuit is as follows.

$$\text{(Delay Time)} = td\textcircled{1} + \sum_{i=0}^{k-1} (td\textcircled{2}i + td\textcircled{3}i) + td\textcircled{4} + td\textcircled{5} \quad (2)$$

In this circuit the output of the k-th stage of the delay gate (Xk-1) is selected by the logical gate XS. Further, ① indicates a delay of wiring from the input gate IN to the gates, ② indicates delays of delay gates Xi, ③ indicates delays due to output loads (wirings etc.) of the delay gates Xi, ④ indicates a delay of the logical gate XS, and ⑤ indicates a delay of wiring from the logical gate XS to the output terminal OUT. To improve the linearity of the delay time (to render constant the variable width), respective values of td ②i and td ③i in the range of $0 \leq i \leq n-1$ are equalized.

In Embodiment 2, adjusting wirings are only at i locations, the outputs N0 through Ni-1 (which correspond only to the output portions of the gates in the conventional example), and, accordingly, restrictions on the layout pattern are alleviated. That is, the wiring region can be downsized and the linearity of the delay time can be improved. Also, the number of gates and the power consumption can be reduced by simplifying the structure of the selector.

EMBODIMENT 3

FIGS. 3(a) and 3(b) respective illustrate the structure of a 2-bit variable delay circuit using inverter gates and NOR gates and a timing chart in accordance with Embodiment 3 of the present invention. This circuit includes the input terminal IN, an inverter INV for receiving an output from the input terminal IN, a delay gate Xl comprising an inverter Xla for receiving an output N0 from the inverter INV and a 2-input NOR gate Xlb for receiving an output from the inverter Xla and a control signal Sl, a logical gate XS, a 2-input NOR gate, for receiving the output N0 from the inverter INV and an output Nl from the delay gate Xl and the output terminal OUT of the logical gate XS.
(1) A case where a control signal Sl is high (H):

The output Nl from the 2-input NOR gate Xlb is always L and, therefore, the output waveform from the output terminal OUT is retarded compared with the input waveform by a delay time of INV+XS, both at its leading edge and its trailing edge.

(2) A case where the control signal Sl is low (L):

The output Nl of the 2-input NOR gate Nlb is retarded compared with the input waveform by a delay time of INV+Xla+Xlb, both at its leading edge and its trailing edge. Therefore, the output waveform is as follows.
(a) Trailing edge:

The trailing edge from the inverter INV becomes effective. That is, the output waveform is retarded, compared with the input waveform, by a delay time of INV+XS. (This is the same as the case where the control signal Sl is H.)
(b) Leading edge:

The leading edge from the output Xl becomes effective. That is, the output waveform is retarded, compared with the input waveform, by a delay time of INV+Xla+Xlb+XS. (The output waveform is retarded by a delay time of Xla+Xlb, longer than in the case where the control signal Sl is H.) Accordingly, when only the leading edge is noted, the leading edge of the input waveform can be retarded by a delay time of the inverter plus the delay time of the 2-input NOR gate by switching the control signal Sl as H→L.

In Embodiment 3, adjusting wirings are only present at two locations, the outputs of N0 and Nl (which correspond to only the output portions of the gates in the conventional example), and, accordingly, restrictions on layout pattern are alleviated. That is, the wiring region can be downsized and the linearity of the delay time can be improved. Also, the number of gates and the power consumption can be reduced by simplifying the structure of the selector.

EMBODIMENT 4

FIGS. 4(a), 4(b), and 4(c) respectively illustrate an n-bit variable delay circuit using inverter gates and NOR gates, its output states, and a timing chart in accordance with Embodiment 4 of the present invention.

The circuit of FIG. 4(a) includes the input terminal IN, an inverter INV for receiving a signal from the input terminal IN, a delay gate Xl for receiving an output of N0 from the inverter INV and a control signal Sl and comprising an inverter Xla receiving the output N0 and a 2-input NOR gate Xlb receiving an output from the inverter Xla and the control signal Sl, delay gates Xl for receiving outputs Ni-1 of delay gates Xi-1 and control signals Si, a logical gate XS, an n-input NOR gate, receiving the output N0 of the inverter INV and the outputs Ni of the delay gates Xi and the output terminal OUT of the logical gate XS.

The trailing edge of the input data is output after a constant delay time irrespective of the control signals as in Embodiments 1, 2, and 3. An explanation will be given of the leading edge of the input data as follows.
(1) A case where the control signal Sl is high (H):

The outputs Nl through Nn-1 are always L and, therefore, the leading edge of the output waveform from the output terminal OUT is retarded by a delay time of INV+XS.
(2) A case where S0 . . . Sk-1=L, Sk=H ($2 \leq k \leq n-1$):

The outputs Nk through Nn-1 are always H and the outputs N0 through Nk-1 are retarded by the inverter INV+ (k-1) stages of inverters and 2-input NOR gates. Therefore, the data of the output Nk-1 becomes effective and the leading edge of the output waveform is retarded, compared with the input waveform, by a delay time of INV+(k-1) stages of (inverter+2-input NOR)+XS.

The delay time of the leading edge of this circuit is shown as follows.

$$\text{(Delay Time)} = td\text{①} + \sum_{i=1}^{k} (td\text{②}i + id\text{③}i) + td\text{④} + td\text{⑤} \quad (5)$$

In this circuit, the output of the k-th stage of the delay gate (Xk-1) is selected by a selector. ① indicates a delay by wiring from the input terminal IN to the inverter INV, ② delays of the delay gates Xi, ③ indicates delays due to output loads (wirings etc.) of the delay gates Xi, ④ indicates a delay of the logical gate XS, and ⑤ indicates a delay of a wiring from the logical gate XS to the output terminal OUT. To improve the linearity of the delay time (to render constant the variable width), respective values of td ② i and td ③ i in the range of $0 \leq i \leq n-1$ are to be equalized.

In Embodiment 4, adjusting wirings are present only at i locations, the outputs N0 through Ni-1 (which correspond only to the output portions of the gates in the conventional example), and, therefore, restrictions on layout pattern are alleviated. That is, the wiring region can be downsized and the linearity of the delay time can be improved. Also, the number of gates and the power consumption can be reduced by simplifying the structure of the selector.

EMBODIMENT 5

FIGS. 5(a) and 5(b) respectively illustrate a 2-bit variable delay circuit using inverter gates and NOR gates and a timing chart in accordance with Embodiment 5 of the present invention.

To make the circuit of Embodiment 3, the inverter INV between the input terminal and the delay gate Xl is removed and an inverter INV is inserted between the logical gate XS of a 2-input NQR gate and the output terminal OUT. The operation of this circuit is equivalent to that where the waveform of the output N0 in Embodiment 3 is input, the waveform of the output terminal OUT is inverted and delayed by a single inverter stage, which is as illustrated in the timing chart of FIG. 5(b). When only the trailing edge of the input waveform is noted, the trailing edge of the input waveform can be retarded by the delay time of the inverter plus the delay time of the 2-input NOR gate by switching the control signal as H→L.

In Embodiment 5, adjusting wirings are only present at two locations, the outputs N0 and N1 (which correspond only to the output portions of the gates in the conventional examples), and, therefore, restrictions on layout pattern are alleviated. That is, the wiring region can be downsized and the linearity of the delay time can be improved. Also, the number of gates and the power consumption can be reduced by simplifying the structure of the selector.

EMBODIMENT 6

FIGS. 6(a), 6(b), and 6(c) respectively illustrate an n-bit variable delay circuit using inverter gates and NOR gates, its output states, and a timing chart in accordance with Embodiment 6 of the present invention.

To make the circuit of Embodiment 4, the inverter INV between the input terminal IN and the delay gate Xl is removed and an inverter INV is inserted between the logical gate XS of an n-input NOR gate and the output terminal OUT. The operation of this circuit is equivalent to that where the waveform of the output N0 in Embodiment 4 is input and the waveform from the output terminal OUT is inverted and retarded by a single stage of the inverter, which is as illustrated in the timing chart of FIG. 6(c).

The delay time of the trailing edge of this circuit is shown as follows.

$$\text{(Delay Time)} = td\text{①} + \sum_{i=0}^{k-1} (td\text{②}i + td\text{③}i) + td\text{④} + td\text{⑤} + td\text{⑥} \quad (4)$$

In this circuit the output of the k-th stage of gate is selected by a selector. ① indicates a delay of wiring from the input terminal IN to the delay gate Xl, ② indicates delays of the delay gates Xi (Xia+Xib), ③ indicates delays due to output loads (wirings etc.) of the delay gates Xi, ④ indicates a delay of the logical gate XS, ⑤ indicates a delay of a wiring from the logical gate to the output terminal OUT, and (6) indicates a delay of the inverter INV. To improve the linearity of the delay time (to render constant the variable width), respective values of td ② k and td③ k in the range of $1 \leq k \leq n$ are to be equalized.

In Embodiment 6, adjusting wirings are only present at i locations, N0 through Ni-1 (which correspond only to the output portions of the gates in the conventional example), and, accordingly, restrictions on layout pattern are alleviated. That is, the wiring region can be downsized and the linearity of the delay time can be improved. Also, the number of gates and the power consumption can be reduced by simplifying the structure of the selector.

EMBODIMENT 7

FIG. 7 illustrates the structure of an n-bit variable delay circuit in accordance with Embodiment 7 of the present invention. In FIG. 7, a load gate (inverter) Yn is added to the delay gate Xn-1 of Embodiment 4. The linearity of the delay time is improved by equalizing the loads of the inverter INV and the delay gates Xl through Xn-1. Embodiment 7 is applicable to Embodiments 1, 2, 3, 5, and 6.

EMBODIMENT 8

Figure 8B:
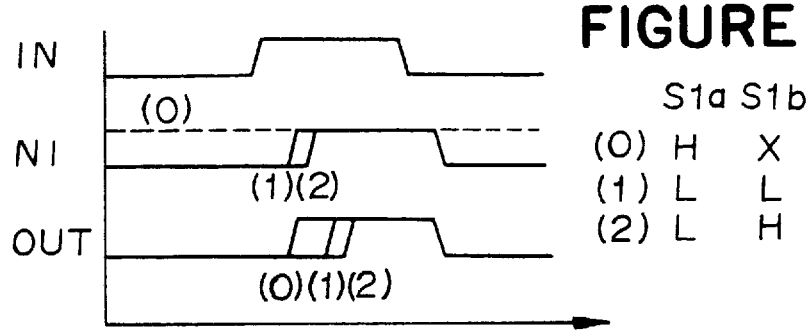

FIGS. 8(a) and 8(b) respectively illustrate a 2-bit variable delay circuit and a timing chart in accordance with Embodiment 8 of the present invention. In FIG. 8(a), the structure of the delay gate of the Embodiment 3 is changed into a structure indicated by a dotted line, in which an inverter Xla and a 2-input NOR gate Xlc to both of which an output N0 is respectively input, and a 3-input NOR gate Xld receiving outputs of the inverter Xla and the 2-input NOR gate Xlc and a control signal Sla, are provided and a control signal Slb is input to the 2-input NOR gate Xlc. As in Embodiment 3, the delay time of the leading edge can be controlled by the delay time of the delay gate by the control signal Sla.

In this circuit, the delay time of one stage of the delay gate can be controlled by applying the technology disclosed in Japanese Patent Application No. Hei. 6-260245. In Japanese Patent Application No. Hei. 6-260245, when the control signal Slb is H, the delay time of the leading edge is increased, whereas, when the control signal Slb is L, the delay time of the leading edge is reduced. A simple explanation of this principle follows.

The rise (L→H) of the input waveform input to the input terminal IN corresponds to the falling (H→L) of the output N0 and the rise of the outputs of the inverter Xla and the 2-input NOR gate Xlc. Further, in Embodiment 8, DCFL (Direct Coupled FET Logic) is used as the basic gate.

Figure 8C:
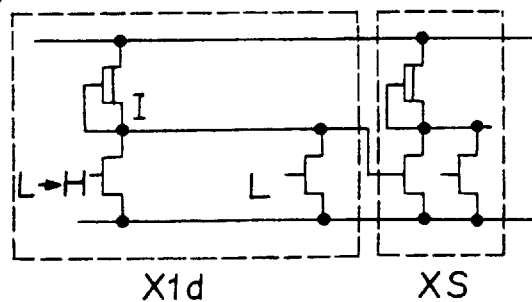
Figure 8D:
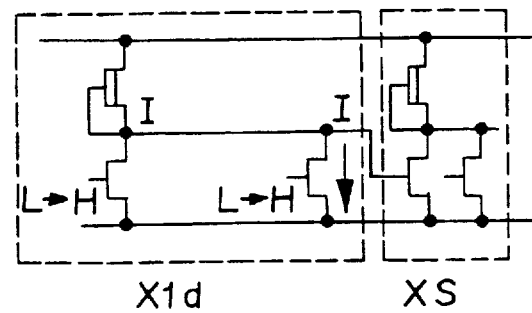

(1) A case where the control signal Slb is H (FIG. 8(c)):

The output of the 2-input NOR gate Xlc becomes L and the output of the inverter Xla is L→H. Thereby, electrical charge stored at the input gate (gate capacitor of transistor) of the logical gate XS, to which the output of the 3-input NOR gate Xld is connected, is drawn out only by the EFET of the 3-input NOR gate Xld to which the output (L→H) of the inverter Xla is connected.

(2) A case where the control signal Slb is L (FIG. 8 (d)):

The outputs of the inverter Xla and the 2-input NOR gate Xlc are L→H. Thereby, electrical charge stored at the input gate (gate capacitor of a transistor) of the logical gate XS, to which the output of the 3-input NOR gate Xld is connected, is drawn out by the EFET of the 3-input NOR gate Xld, to which the output (L→H) of the inverter Xla is connected, and another EFET of the 3-input NOR gate Xld to which the output (L→H) of the 2-input NOR gate Xlc is connected.

Therefore, when the control signal Slb is L, the delay time of the leading edge becomes shorter than that when the control signal Slb is H. In Embodiment 8, adjusting wirings are present at only two locations, N0 and N1 (which correspond to only the output portions of the gates in the conventional example), and, therefore, restrictions on layout pattern are alleviated and the delay time of one gate stage, as disclosed in Japanese Patent Application No. Hei. 6-260245, is controlled without considerably increasing the number of gates (one 3-input NOR gate per gate stage).

EMBODIMENT 9

FIGS. 9(a), 9(b), and 9(c) respectively illustrate an n-bit variable delay circuit, its output states, and a timing chart in accordance with Embodiment 9 of the present invention. In FIG. 9(a), the structure of the delay gate in Embodiment 4 is changed into a structure indicated by a dotted line in FIG. 9(a). An inverter Xla and a 2-input NOR gate Xlc, to both of which the output N0 is respectively input, and a 3-input NOR gate Xld receiving outputs of the inverter Xla and the 2-input NOR gate Xlc and a control signal Sla are provided, and a control signal Slb is input to the 2-input NOR gate Xlc. As in Embodiment 4, the delay time of the leading edge can be controlled by the delay time of the gate delay by control signals Sik ($1 \leq k \leq n-1$). Further, in this circuit the delay time of one stage of the delay gate can be adjusted by applying the technology of Japanese Patent Application No. Hei. 6-260245 as in Embodiment 8.

In Embodiment 9, adjusting wirings are present only at i locations of N0 through Ni-1 (which correspond only to the output portions of the gates in the conventional example), and, accordingly, the restrictions on the layout pattern are alleviated and the delay time of one gate stage disclosed in Japanese Patent Application No. Hei. 6-260245 is controlled without considerably increasing the number of gates (one 3-input NOR gate per gate stage).

EMBODIMENT 10

Figure 10:
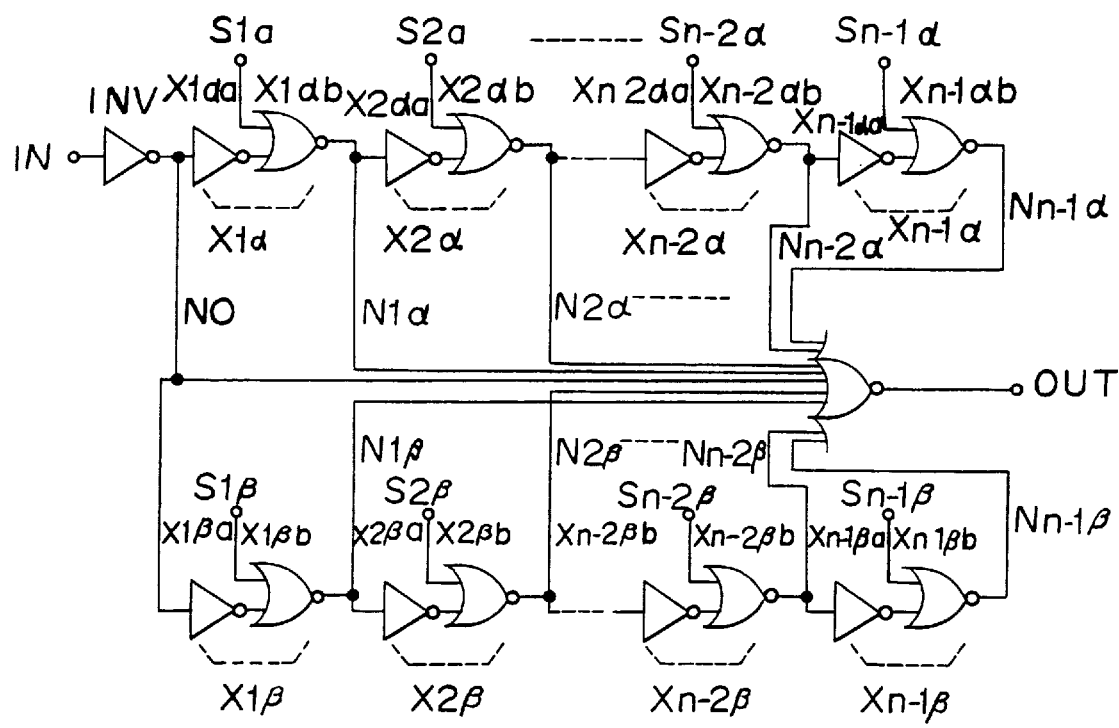
FIG. 10 is a diagram showing an n-bit variable delay circuit in accordance with Embodiment 10 of the invention.

FIG. 10 illustrates an n-bit variable delay circuit in accordance with Embodiment 10 of the present invention. In FIG. 10, two routes selected from the delay gates of Embodiments 1 through 9 are provided and the resolution of each route (delay time of delay gate) is changed by changing the number of gates of each route.

Assuming that the gate delay time per stage of a route α is tdβ and the gate delay time per stage of a route β is tdβ, the following relationship is established.

$$\text{(Delay Time)} = tda + k \times td\alpha \text{ (route } \alpha\text{)}$$
$$= tda + k \times td\beta \text{ (route } \beta\text{)}$$

where tda is the delay time when all of the control signals are H. In this way, two arbitrary delay time resolutions can be provided. Further, Embodiment 10 is effective when the number of routes is three or more.

According to Embodiment 10, adjusting wirings in a circuit necessitating two or more kinds of delay time resolutions are only present at i locations of N0 through Ni-1 (which correspond only to the output portions of the gates in the conventional example) and, therefore, restrictions on the layout pattern are alleviated. That is, the wiring region can be downsized and the linearity of the delay time can be improved. Further, the number of gates and the power consumption can be reduced by simplifying the structure of the selector.

EMBODIMENT 11

Figure 11:
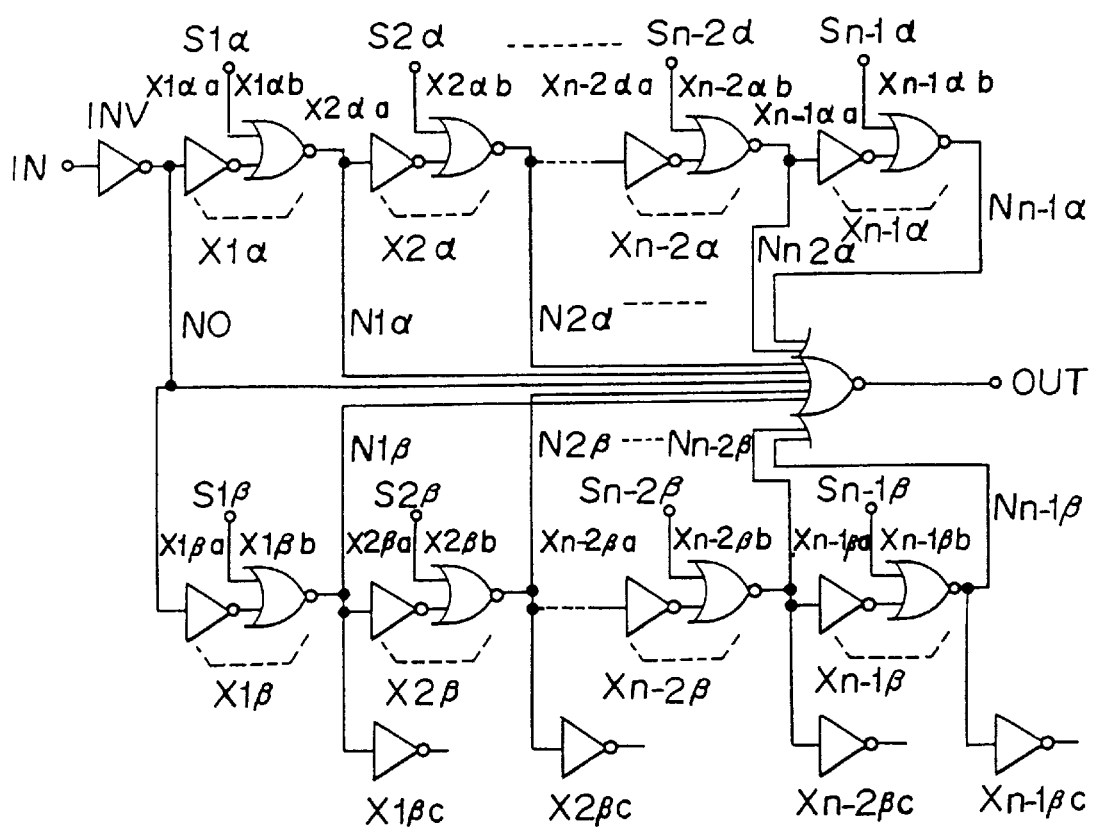
FIG. 11 is a diagram showing of an n-bit variable delay circuit in accordance with Embodiment 11 of the invention.

FIG. 11 illustrates an n-bit variable delay circuit in accordance with Embodiment 11 of the present invention. In FIG. 11, two routes selected from the delay gates of Embodiments 1 through 9 are provided, load gates Xn-1β are added to respective delay gates Xn-1β in one of the routes and the loads of the gates of each route (the fan-out number in this case) are changed, thereby changing the resolution of each route (delay time of delay gate).

For example, assuming that a gate delay time per stage of a route α is tdα and a gate delay time per stage of a route β is tdβ, the following relationship is established.

$$\text{(Delay Time)} = tda + k \times td\alpha \text{ (route } \alpha\text{)}$$
$$= tda + k \times td\beta \text{ (route } \beta\text{)}$$

where tda is the delay time when all of the control signals are H. In this way, two arbitrary delay time resolutions can be provided. Further, Embodiment 11 is effective when the number of routes is three or more. The loads of gates of each route can be changed by other than the fan-out number, for example, by changing lengths of wirings, etc.

According to Embodiment 11, adjusting wirings in a circuit necessitating two or more delay time resolutions are present only at i locations of N0 through Ni-1 (which correspond only to the output portions of the gates in the conventional example) and, accordingly, restrictions on the layout pattern are alleviated. That is, the wiring region can be downsized and the linearity of the delay time can be improved. Also, the number of gates and the power consumption can be reduced by simplifying the structure of the selector.

EMBODIMENT 12

Figure 12:
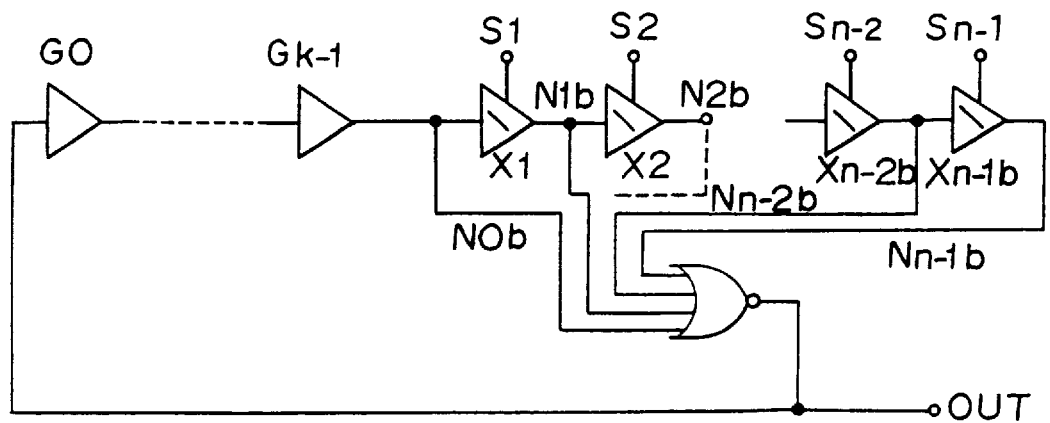
FIG. 12 is a diagram showing a variable oscillation frequency ring oscillator in accordance with Embodiment 12 of the invention.

FIG. 12 illustrates a ring oscillator with a variable oscillation frequency in accordance with Embodiment 12 of the present invention. In FIG. 12, the delay gates of Embodiments 1, 3, and 5 are applied to a ring oscillator. The oscillation frequency of the ring oscillator can be made variable by replacing one of gates, Gk, among the gates G0 through Gk of the ring oscillator, with the variable delay circuit shown by Embodiments 1, 3, and 5 of the present invention.

EMBODIMENT 13

Figure 13:
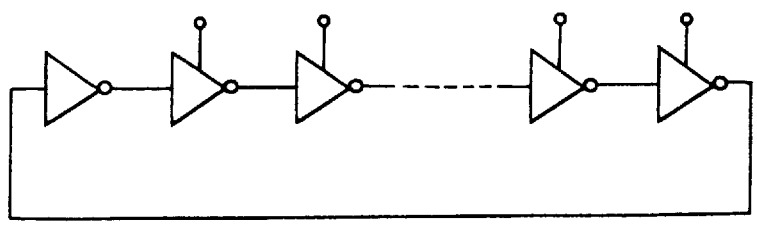
FIG. 13 is a diagram showing a variable oscillation frequency ring oscillator in accordance with Embodiment 13 of the invention.

FIG. 13 illustrates a ring oscillator with variable oscillation frequency in accordance with Embodiment 13 of the present invention. In FIG. 13, the variable delay circuits of Embodiments 1 through 11 are applied to a ring oscillator. The variable delay circuits in accordance with any of Embodiments 1 through 11 of the present invention are connected in series and a ring circuit is completed by adding one inverter, thereby forming the ring oscillator. Thus, the oscillation frequency of the ring oscillator is variable.

EMBODIMENT 14

Figure 14A:
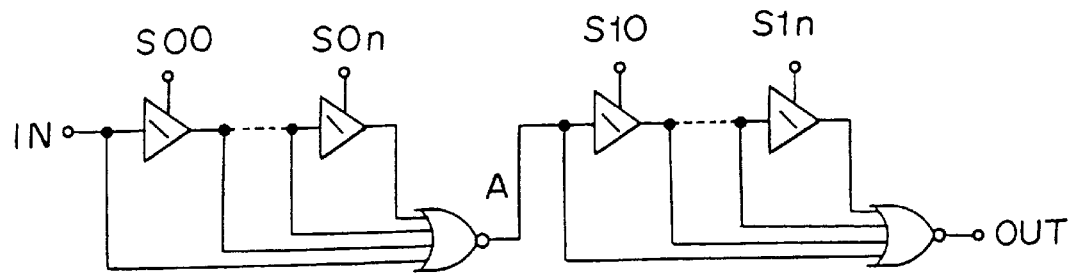
FIGS. 14(a) and 14(b) respectively show a pulse width variable circuit in accordance with Embodiment 14 of the invention and a timing chart.
Figure 14B:
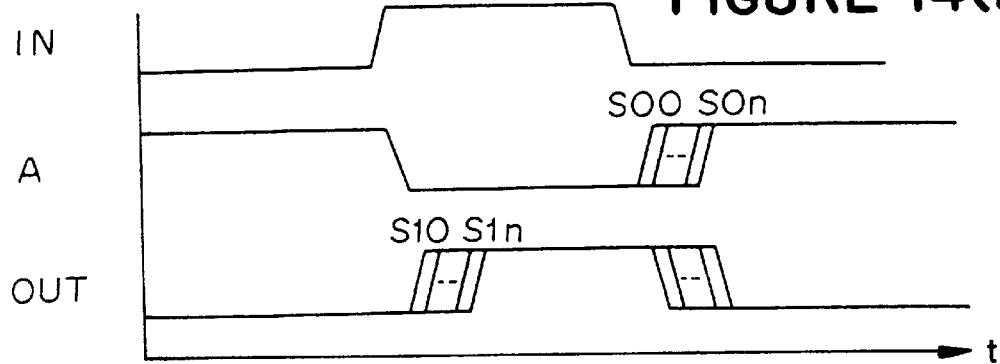
Figure 15:
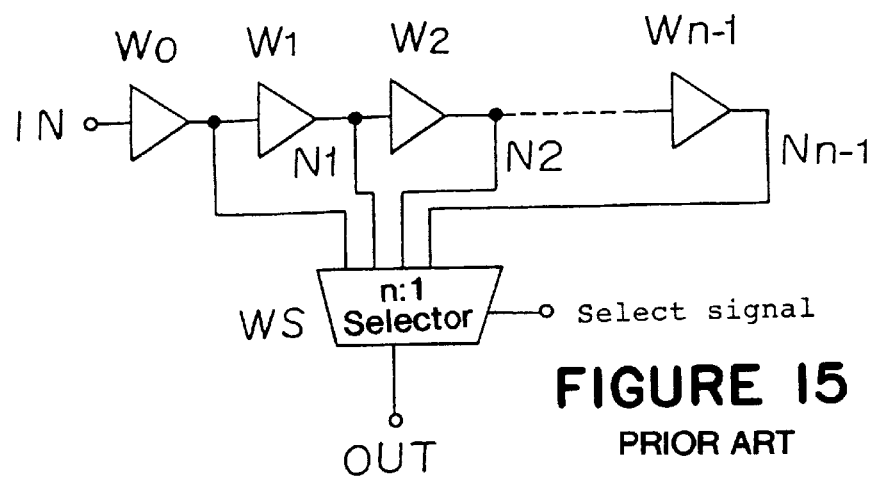
FIG. 15 is a diagram showing a conventional n bit variable delay circuit.
Figure 16:
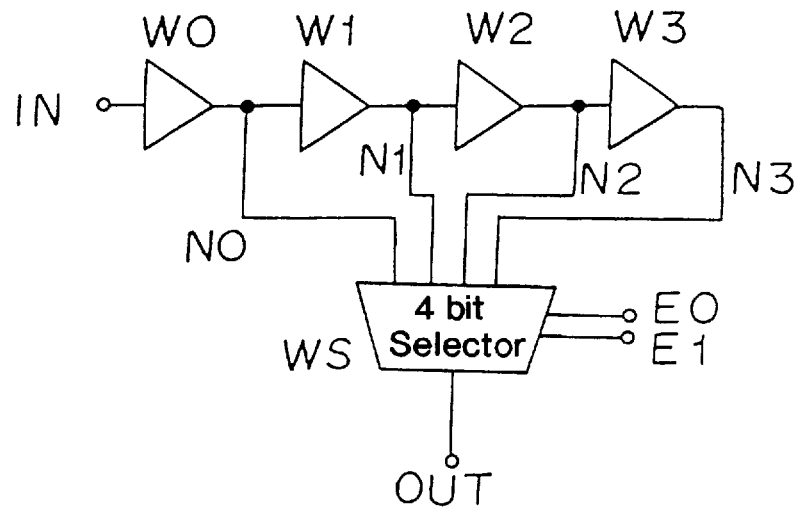
FIGS. 16(a) and 16(b) respectively show a conventional 4-bit variable delay circuit and a selector circuit.
Figure 16:
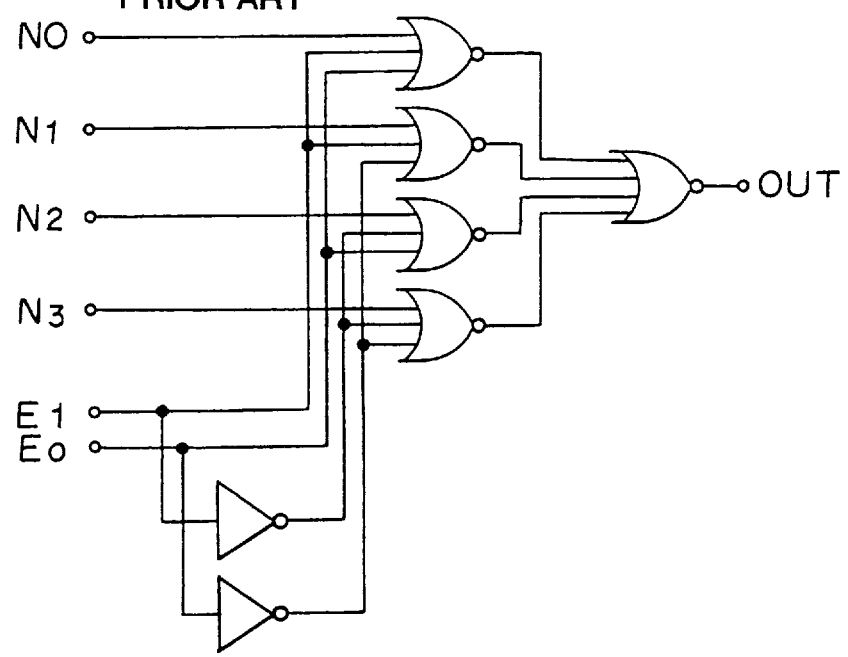

FIGS. 14(a) and 14(b) respectively illustrate a pulse width variable circuit and output states of the circuit in accordance with Embodiment 14 of the present invention. FIG. 14 shows a pulse width adjusting circuit having, connected in series, two of the variable circuits disclosed in any of Embodiments 1 through 11. The leading edge of a pulse can be adjusted by adjusting control signals S00 through S0n of a first stage of the variable delay circuit and the trailing edge of the pulse can be adjusted by adjusting control signals Sl0 to Sln of a second stage of the variable delay circuit. In this way the width of a pulse can be adjusted.

What is claimed is:

1. A variable delay circuit comprising:

an input terminal for receiving a signal to be delayed;

2 n stages of delay gates, where n is an integer larger than 1, including respective first and second routes in each of which the stages of delay gates are connected in series so that an output from one stage, other than a final stage, is input to a next stage, a first stage in each of the first and second routes receiving a signal to be delayed, whereby two routes of n stages of delay gates connected in parallel are provided;

a logical gate receiving outputs of each of the stages of each of the first and second routes for producing a delayed signal; and an output terminal for outputting the delayed signal wherein each of the stages includes a control terminal for receiving a respective control signal.

2. The variable delay circuit according to claim 1, wherein each of the stages of delay gates in one of the two routes includes a respective load gate connected to an output terminal of the corresponding stage.

3. A variable delay circuit comprising:

an input terminal for receiving a signal to be delayed;

a delay gate connected to the input terminal;

a logical gate having first and second inputs, the first input receiving a signal input to the delay gate and the second input receiving a signal output by the delay gate, the logical gate producing a delayed signal; and an output terminal for outputting the delayed signal wherein the delay gate includes:

an inverter;

a first gate having first and second inputs, the inverter and the first input of the first gate receiving the signal to be delayed, the second input of the first gate receiving a first control signal; and a second gate having first, second, and third inputs, the first input receiving an output of the inverter, the second input receiving an output of the first gate, and the third input receiving a second control signal, the second gate producing an output of the delay gate supplied to the logical gate.

4. A variable delay circuit comprising:

an input terminal for receiving a signal to be delayed;

n stages of delay gates, where n is an integer larger than 1, the n stages of delay gates being connected in series so that an output from one stage, other than a final stage, is input to a next stage, a first stage receiving a signal to be delayed;

a logical gate receiving outputs of each of the stages for producing a delayed signal; and an output terminal for outputting the delayed signal wherein each of the delay gates includes:

an inverter;

a first gate having first and second inputs, the inverter and the first input of the first gate receiving the signal to be delayed, the second input of the first gate receiving a first control signal; and a second gate having first, second, and third inputs, the first input receiving an output of the inverter, the second input receiving an output of the first gate, and the third input receiving a second control signal, the second gate producing an output of the delay gate supplied to the logical gate.

5. The variable delay circuit according to claim 1, including an inverter connected to the input terminal, the inverter having an output terminal connected to each of the two routes and to the logical gate.

6. The variable delay circuit according to claim 1, wherein each of the stages of delay gates includes an input terminal, an inverter connected to the input terminal of the stage, and a stage gate having first and second inputs, the first input receiving an output of the inverter and the second input being connected to the control terminal of the stage.

7. The variable delay circuit according to claim 6, wherein each of the stage gates and the logical gate are NOR gates.

8. The variable delay circuit according to claim 3, including an inverter connected to the input terminal, the inverter having an output connected to the delay gate and to the logical gate.

9. The variable delay circuit according to claim 3, wherein the first and second gates in the delay gate are NOR gates.

10. The variable delay circuit according to claim 4, including an inverter connected to the input terminal, the inverter having an output terminal connected to a first delay gate and to the logical gate.

11. The variable delay circuit according to claim 4, wherein the first and second gates in each of the delay gates are NOR gates.

* * * * *